United States Patent
Iwamoto

(10) Patent No.: US 10,666,223 B2
(45) Date of Patent: May 26, 2020

(54) ELASTIC WAVE DEVICE

(71) Applicant: Murata Manufacturing Co., Ltd., Nagaokakyo-shi, Kyoto-fu (JP)

(72) Inventor: Takashi Iwamoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 21 days.

(21) Appl. No.: 16/177,546

(22) Filed: Nov. 1, 2018

(65) Prior Publication Data

US 2019/0074815 A1 Mar. 7, 2019

Related U.S. Application Data

(63) Continuation of application No. PCT/JP2017/011577, filed on Mar. 23, 2017.

(30) Foreign Application Priority Data

Jun. 14, 2016 (JP) .................. 2016-117572

(51) Int. Cl.
*H03H 9/02* (2006.01)

(52) U.S. Cl.
CPC .... *H03H 9/02992* (2013.01); *H03H 9/02574* (2013.01); *H03H 9/02834* (2013.01); *H03H 9/02866* (2013.01); *H03H 9/02559* (2013.01)

(58) Field of Classification Search
CPC .......... H03H 9/02992; H03H 9/02574; H03H 9/02834; H03H 9/02866; H03H 9/02559
See application file for complete search history.

(56) References Cited

U.S. PATENT DOCUMENTS

| 5,438,212 | A | 8/1995 | Okaniwa |
| 5,731,067 | A | 3/1998 | Asai et al. |
| 2004/0226162 | A1 | 11/2004 | Miura et al. |
| 2017/0222619 | A1 | 8/2017 | Iwamoto et al. |

FOREIGN PATENT DOCUMENTS

| JP | 06-310547 A | 11/1994 |
| JP | 08-335782 A | 12/1996 |
| JP | 2004-343359 A | 12/2004 |
| JP | 2007-019425 A | 1/2007 |
| JP | 2008-258578 A | 10/2008 |
| JP | 2009-159195 A | 7/2009 |
| JP | 2011-071693 A | 4/2011 |
| WO | 2016/084526 A1 | 6/2016 |

OTHER PUBLICATIONS

Official Communication issued in International Patent Application No. PCT/JP2017/011577, dated May 9, 2017.

*Primary Examiner* — Samuel S Outten
(74) *Attorney, Agent, or Firm* — Keating & Bennett, LLP

(57) ABSTRACT

An elastic wave device includes a substrate including a piezoelectric film, a first IDT electrode, a first external electrode, and a first through via electrode. The first IDT electrode is provided on a first main surface of the substrate and includes a first busbar and first electrode fingers extending from the first busbar. The first external electrode is provided on a second main surface of the substrate. The first through via electrode penetrates the substrate from the first main surface to the second main surface and electrically connects the first IDT electrode and the first external electrode to each other. At least a portion of the first through via electrode overlaps the first busbar in a plan view from the first main surface side and is disposed below the first busbar.

19 Claims, 6 Drawing Sheets

ELASTIC WAVE DEVICE

CROSS REFERENCE TO RELATED APPLICATIONS

This application claims the benefit of priority to Japanese Patent Application No. 2016-117572 filed on Jun. 14, 2016 and is a Continuation Application of PCT Application No. PCT/JP2017/011577 filed on Mar. 23, 2017. The entire contents of each application are hereby incorporated herein by reference.

BACKGROUND OF THE INVENTION

1. Field of the Invention

The present invention relates to an elastic wave device, and particularly to an elastic wave device including an IDT (interdigital transducer) electrode.

2. Description of the Related Art

As an example of an elastic wave device, an elastic wave device in which an IDT electrode including a plurality of electrode fingers are formed on a main surface of a piezoelectric substrate has been disclosed. In such an elastic wave device, heat is easily generated in the IDT electrode (mainly in the electrode fingers).

However, in the existing elastic wave device, sufficient countermeasures have not been taken against heat generated in the IDT electrode. That is, a wiring path from the IDT electrode to an external electrode may be a heat dissipation path, and, for example, there are many existing elastic wave devices having a large wiring distance from an IDT electrode to an external electrode or having a narrow wiring width. In such an elastic wave device, it is impossible to sufficiently dissipate heat from the IDT electrode, and the heat easily remains in the IDT electrode or in the vicinity of the IDT electrode. Therefore, the temperature of the electrode fingers excessively increases, and further there is a possibility that the electrode fingers will be broken by stress electrochemical migration.

Japanese Unexamined Patent Application Publication No. 2009-159195 discloses a configuration in which the wiring distance from an IDT electrode to an external electrode is relatively small. In this configuration, the IDT electrode and the external electrode are connected to each other via a wire extended on a main surface of a piezoelectric substrate from the IDT electrode, and a through via electrode that penetrates the piezoelectric substrate.

However, in Japanese Unexamined Patent Application Publication No. 2009-159195, a through via electrode formed from a metal having a high thermal conductivity is disposed at a position spaced away from the IDT electrode, which is a portion that generates heat during operation, and thus sufficiently high heat-dissipation property is not exhibited. Furthermore, in the case in which a through electrode is provided below a pad portion, it is possible to improve the heat-dissipation property by increasing the size of the through electrode, but the size of the elastic wave device is increased.

SUMMARY OF THE INVENTION

Preferred embodiments of the present invention provide elastic wave devices that achieve size reduction and are able to efficiently dissipate heat generated in an IDT electrode.

An elastic wave device according to a preferred embodiment of the present invention includes a substrate, a first IDT electrode, a first external electrode, and a first through via electrode. The substrate includes a first main surface, a second main surface located at opposite sides to each other, and a piezoelectric film. The first IDT electrode is provided on the first main surface and includes a first busbar and a plurality of first electrode fingers extending from the first busbar. The first external electrode is provided on the second main surface. The first through via electrode penetrates the substrate from the first main surface to the second main surface and electrically connects the first IDT electrode and the first external electrode to each other. At least a portion of the first through via electrode overlaps the first busbar in a plan view from the first main surface side and is disposed directly below the first busbar.

In the elastic wave device, since at least the portion of the first through via electrode overlaps the first busbar in the plan view and is disposed directly below the first busbar, a wiring path from the first IDT electrode to the first external electrode is short. Therefore, heat generated in the first IDT electrode is easily transmitted through the first through via electrode to the first external electrode. That is, the efficiency of transmission of heat to the first external electrode is improved. Thus, heat is easily dissipated from the first IDT electrode. In addition, since at least the portion of the first through via electrode is disposed directly below the first busbar, it is possible to reduce the size of the substrate.

In an elastic wave device according to a preferred embodiment of the present invention, the first through via electrode is preferably directly connected to the first external electrode.

According to this configuration, the first through via electrode is directly connected to the first external electrode without another wiring interposed therebetween. Thus, it is possible to efficiently transmit heat generated in the first IDT electrode to the first external electrode.

In an elastic wave device according to a preferred embodiment of the present invention, the first through via electrode may include an overlapping portion that overlaps at least a portion of the plurality of first electrode fingers in the plan view.

According to this configuration, it is possible to efficiently dissipate heat generated in the first IDT electrode through the overlapping portion.

An elastic wave device according to a preferred embodiment of the present invention may further include a second IDT electrode, a second external electrode, and a second through via electrode. The second IDT electrode is provided on the first main surface and includes a second busbar disposed so as to face the first busbar and a plurality of second electrode fingers extending from the second busbar toward the first busbar. The second external electrode is provided on the second main surface. The second through via electrode penetrates the substrate from the first main surface to the second main surface and electrically connects the second IDT electrode and the second external electrode to each other. At least a portion of the second through via electrode overlaps the second busbar in the plan view and is disposed directly below the second busbar.

According to this configuration, since at least the portion of the second through via electrode overlaps the second busbar in the plan view and is disposed directly below the second busbar, a wiring path from the second IDT electrode to the second external electrode is short. Therefore, heat generated in the second IDT electrode is easily transmitted through the second through via electrode to the second external electrode. That is, the efficiency of transmission of heat to the second external electrode is improved. Thus, heat is also easily dissipated from the second IDT electrode. In addition, since at least the portion of the second through via electrode is disposed directly below the second busbar, it is possible to reduce the size of the substrate.

In an elastic wave device according to a preferred embodiment of the present invention, the substrate preferably further includes a support supporting the piezoelectric film. Preferably, the piezoelectric film includes, as a main component, at least one selected from the group consisting of lithium tantalate and lithium niobate, and the support includes silicon as a main component. More preferably, the substrate further includes an intermediate layer interposed between the piezoelectric film and the support, and the intermediate layer includes silicon oxide as a main component.

According to this configuration, it is possible to reduce the thickness of the piezoelectric film. Therefore, the distance from the IDT electrode to the support, which has high thermal conductivity, is decreased, so that it is possible to dissipate heat through the support. In addition, the through via electrode is easily provided.

In elastic wave devices according to preferred embodiments of the present invention, it is possible to efficiently dissipate heat generated in the IDT electrode, while size reduction is achieved.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 3A shows a result of simulation for the elastic wave device according to the first preferred embodiment of the present invention, and FIG. 3B shows a result of simulation for an existing elastic wave device.

DETAILED DESCRIPTION OF THE PREFERRED EMBODIMENTS

Preferred embodiments of the present invention will be described below with reference to the drawings.

First Preferred Embodiment

Figure 1:
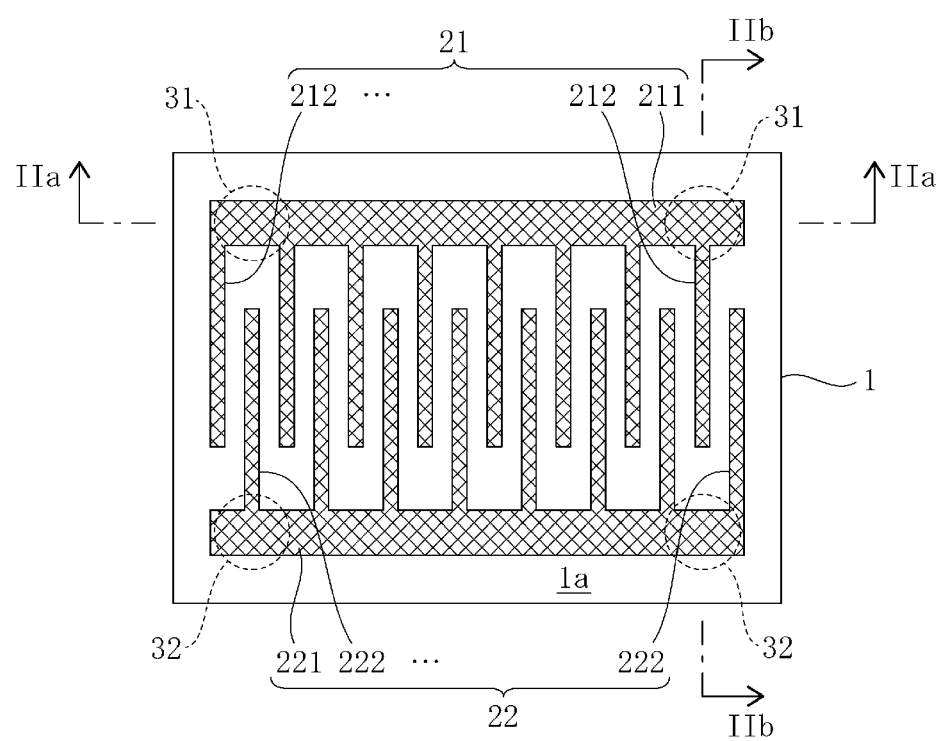
FIG. 1 is a plan view conceptually illustrating an elastic wave device according to a first preferred embodiment of the present invention.
Figure 2A:
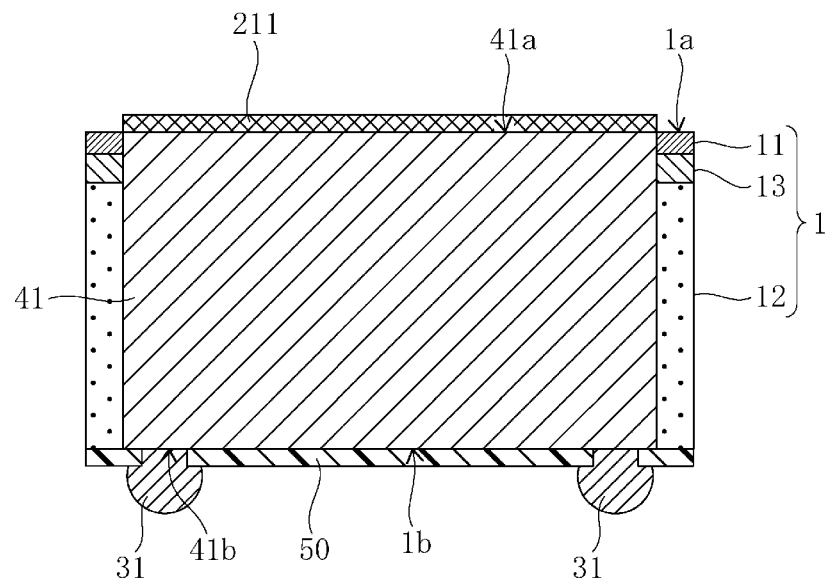
FIG. 2A is a cross-sectional view taken along a line IIa-IIa shown in FIG. 1.
Figure 2B:
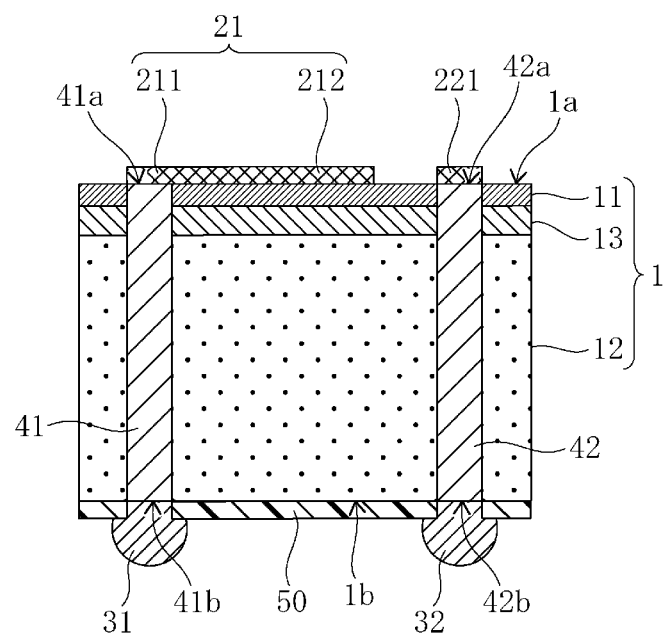
FIG. 2B is a cross-sectional view taken along a line IIb-IIb shown in FIG. 1.

FIG. 1 is a plan view conceptually illustrating an elastic wave device according to a first preferred embodiment of the present invention. FIGS. 2A and 2B are cross-sectional views taken along a line IIa-IIa and a line IIb-IIb shown in FIG. 1, respectively. As shown in FIGS. 1, 2A, and 2B, the elastic wave device includes a substrate 1, a first IDT electrode 21, a second IDT electrode 22, first external electrodes 31, second external electrodes 32, a first through via electrode 41, and a second through via electrode 42.

The substrate 1 includes a piezoelectric film 11, a support 12 that supports the piezoelectric film 11, and an intermediate layer 13 interposed therebetween (see FIG. 2B). Specifically, in the substrate 1, the support 12, the intermediate layer 13, and the piezoelectric film 11 are laminated in this order. The substrate 1 includes a first main surface 1a in which the piezoelectric film 11 is exposed; and a second main surface 1b located at the side opposite to the first main surface 1a. That is, the first main surface 1a is defined by the front surface of the piezoelectric film 11, and the second main surface 1b is defined by the back surface of the support 12.

The piezoelectric film 11 preferably includes, as a main component, for example, at least any one of lithium tantalate (LT) and lithium niobate (LN), which exhibit high piezoelectricity. The piezoelectric film 11 may include, as a main component, various piezoelectric materials that exhibit piezoelectricity suitable for an elastic wave device, other than LT and LN.

The support 12 defines and functions as a high acoustic velocity layer in which the propagation velocity of a bulk wave is higher than that in the piezoelectric film 11. In order to cause the support 12 to define and function as a high acoustic velocity layer, the support 12 preferably includes, for example, silicon (Si) as a main component. The support 12 may include, as a main component, various materials that cause the support 12 to define and function as a high acoustic velocity layer, other than Si.

The intermediate layer 13 defines and functions as a low acoustic velocity layer in which the propagation velocity of a bulk wave is lower than that in the piezoelectric film 11. In order to cause the intermediate layer 13 to define and function as a low acoustic velocity layer, the intermediate layer 13 preferably includes, for example, silicon oxide ($SiO_2$) as a main component. The intermediate layer 13 may include, as a main component, various materials that cause the intermediate layer 13 to define and function as a low acoustic velocity layer, other than $SO_2$.

According to the configuration of the substrate 1, the intermediate layer 13, which is a low acoustic velocity layer, inhibits elastic waves generated in the piezoelectric film 11 from leaking to the second main surface 1b side of the substrate 1. The elastic waves include surface acoustic waves generated on the front surface (first main surface 1a) of the piezoelectric film 11.

The first IDT electrode 21 is a comb-shaped electrode including a first busbar 211 and a plurality of first electrode fingers 212 extending from the first busbar 211 and is provided on the first main surface 1a (see FIG. 1). The first busbar 211 extends in a direction perpendicular or substantially perpendicular to the direction in which the first electrode fingers 212 extend, and is directly connected to one end of each of the plurality of first electrode fingers 212.

The second IDT electrode 22 is a comb-shaped electrode including a second busbar 221 and a plurality of second electrode fingers 222 extending from the second busbar 221, and is provided on the first main surface 1a (see FIG. 1). The second busbar 221 extends in a direction perpendicular or substantially perpendicular to the direction in which the second electrode fingers 222 extend, and is directly connected to one end of each of the plurality of second electrode fingers 222.

Specifically, the first busbar 211 and the second busbar 221 face each other, the first electrode fingers 212 extend from the first busbar 211 toward the second busbar 221, and the second electrode fingers 222 extend from the second busbar 221 toward the first busbar 211. In addition, as an example, the first electrode fingers 212 and the second electrode fingers 222 are alternately arranged in the direction in which the first busbar 211 (or the second busbar 221) extends. The arrangement relationship between the first electrode fingers 212 and the second electrode fingers 222 is not limited thereto, and various modifications are possible.

A solder resist 50 is provided on the second main surface 1b of the substrate 1 (see FIGS. 2A and 2B). The solder resist 50 is opened in regions in which the first external electrode 31 and the second external electrode 32 are provided.

The first external electrodes 31 are provided on the second main surface 1b and connected to the first IDT electrode 21 via the first through via electrode 41. In addition, the second external electrodes 32 are provided on the second main surface 1b and connected to the second IDT electrode 22 via the second through via electrode 42. In the present preferred embodiment, the first external electrodes 31 and the second external electrodes 32 are each preferably bump electrodes, for example. The first external electrodes 31 and the second external electrodes 32 are not limited to the bump electrodes, and various electrodes, such as planar electrodes, for example, may be used. Moreover, in the present preferred embodiment, the two first external electrodes 31 are provided, and the number of first external electrodes 31 is not limited to two and may be 1 or may be three or more. The same applies to the second external electrodes 32.

In the present preferred embodiment, each first external electrode 31 is provided in a region in which at least a portion thereof overlaps the first busbar 211 in a plan view from the first main surface 1a (or second main surface 1b) side (see FIG. 1). In addition, each second external electrode 32 is provided in a region in which at least a portion thereof overlaps the second busbar 221 in a plan view from the first main surface 1a (or second main surface 1b) side. The first external electrode 31 and the second external electrode 32 are not limited thereto, and at least one of the first external electrode 31 and the second external electrode 32 may be provided in a region in which the external electrode does not overlap both the first busbar 211 and the second busbar 221 (see FIG. 6).

The first through via electrode 41 penetrates the substrate 1 from the first main surface 1a to the second main surface 1b and electrically connects the first IDT electrode 21 and the first external electrode 31 to each other (see FIG. 2B). Specifically, the first through via electrode 41 is disposed immediately below the first busbar 211 and linearly extends from the first main surface 1a to the second main surface 1b in a direction perpendicular or substantially perpendicular to these main surfaces. The meaning of "immediately below" includes a meaning that at least a portion is located immediately below and in direct contact. The same applies hereinafter. Specifically, at least a portion of the first through via electrode 41 is located immediately below the first busbar 211 and in direct contact with the first busbar 211.

In the present preferred embodiment, the first through via electrode 41 is connected to the first busbar 211 in a state in which an exposed surface 41a of the first through via electrode 41 on the first main surface 1a entirely or substantially entirely overlaps the region in which the first busbar 211 is provided on the first main surface 1a. Accordingly, the first through via electrode 41 is directly connected to the first busbar 211 without another wiring interposed therebetween.

The first through via electrode 41 may be connected to the first busbar 211 in a state in which at least a portion of the exposed surface 41a on the first main surface 1a overlaps the region in which the first busbar 211 is provided on the first main surface 1a. That is, at least a portion of the first through via electrode 41 may be disposed directly below the first busbar 211. In addition, a close contact conductive layer may be interposed between the first through via electrode 41 and the first busbar 211 so as to bring the first through via electrode 41 and the first busbar 211 into close contact with each other.

As described above, preferably, at least a portion of the first through via electrode 41 overlaps the first busbar 211 in a plan view from the first main surface 1a (or second main surface 1b) side and is disposed immediately below the first busbar 211. This is because the first busbar 211 has a large area, and therefore it is possible to make the cross-sectional area of the first through via electrode 41, which is disposed directly below the first busbar 211, large, and, as a result, it is possible to efficiently dissipate heat. In addition, as described above, preferably, the first through via electrode 41 is directly connected to the first busbar 211. This is because it is possible to efficiently dissipate heat generated in the first IDT electrode 21, to the first through via electrode 41.

Furthermore, the first through via electrode 41 is connected to the first external electrode 31 in a state in which at least a portion of an exposed surface 41b of the first through via electrode 41 on the second main surface 1b overlaps the region in which the first external electrode 31 is provided on the second main surface 1b. That is, the first through via electrode 41 is directly connected to the first external electrode 31 without another wiring interposed therebetween. Accordingly, it is possible to efficiently dissipate heat generated in the first IDT electrode 21, through the first through via electrode 41 to the first external electrode 31.

The second through via electrode 42 penetrates the substrate 1 from the first main surface 1a to the second main surface 1b and electrically connects the second IDT electrode 22 and the second external electrode 32 to each other. Specifically, the second through via electrode 42 is disposed directly below the second busbar 221 and linearly extends from the first main surface 1a to the second main surface 1b in the direction perpendicular or substantially perpendicular to these main surfaces. That is, at least a portion of the second through via electrode 42 is located directly below the second busbar 221 and in direct contact with the second busbar 221.

In the present preferred embodiment, the second through via electrode 42 is connected to the second busbar 221 in a state in which an exposed surface 42a of the second through via electrode 42 on the first main surface 1a entirely or substantially entirely overlaps the region in which the second busbar 221 is provided on the first main surface 1a. Accordingly, the second through via electrode 42 is directly connected to the second busbar 221 without another wiring interposed therebetween.

The second through via electrode 42 may be connected to the second busbar 221 in a state in which at least a portion of the exposed surface 42a on the first main surface 1a overlaps the region in which the second busbar 221 is provided on the first main surface 1*a*. That is, at least a portion of the second through via electrode 42 may be disposed directly below the second busbar 221. In addition, a close contact conductive layer may be interposed between the second through via electrode 42 and the second busbar 221 so as to bring the second through via electrode 42 and the second busbar 221 into close contact with each other.

As described above, preferably, at least a portion of the second through via electrode 42 overlaps the second busbar 221 in a plan view from the first main surface 1*a* (or the second main surface 1*b*) side and is disposed directly below the second busbar 221. This is because the second busbar 221 has a large area, and therefore it is possible to make the cross-sectional area of the second through via electrode 42, which is disposed directly below the second busbar 221, large, and, as a result, it is possible to efficiently dissipate heat. In addition, as described above, preferably, the second through via electrode 42 is directly connected to the second busbar 221. This is because it is possible to efficiently dissipate heat generated in the second IDT electrode 22, to the second through via electrode 42.

Furthermore, the second through via electrode 42 is connected to the second external electrode 32 in a state in which at least a portion of an exposed surface 42*b* of the second through via electrode 42 on the second main surface 1*b* overlaps the region in which the second external electrode 32 is provided on the second main surface 1*b*. That is, the second through via electrode 42 is directly connected to the second external electrode 32 without another wiring interposed therebetween. Accordingly, it is possible to efficiently dissipate heat generated in the second IDT electrode 22, through the second through via electrode 42 to the second external electrode 32.

In the elastic wave device according to the first preferred embodiment, the first through via electrode 41 is disposed directly below the first busbar 211. Therefore, a wiring path from the first busbar 211 to the first external electrode 31 is short, and, as a result, heat generated in the first IDT electrode 21 is easily transmitted through the first through via electrode 41 to the first external electrode 31. That is, the efficiency of transmission of heat to the first external electrode 31 is high. Thus, heat is easily dissipated from the first IDT electrode 21. From the same viewpoint, heat generated in the second IDT electrode 22 is also easily dissipated therefrom.

Furthermore, in the present preferred embodiment, the first through via electrode 41 is directly connected to the first external electrode 31 without another wiring interposed therebetween. Thus, in the elastic wave device according to the first preferred embodiment, the efficiency of transmission of heat to the first external electrode 31 is further improved. From the same viewpoint, the efficiency of transmission of heat to the second external electrode 32 is also further improved.

Moreover, in the present preferred embodiment, in the substrate 1, the support 12, the intermediate layer 13, and the piezoelectric film 11 are laminated in this order. In the substrate 1 having such a configuration, it is possible to structure the piezoelectric film 11 with a thickness of not greater than about 800 nm, for example. The thickness of the piezoelectric film 11 is preferably not less than about 200 nm, for example, such that the function of the piezoelectric film 11 is not decreased.

When the thickness of the piezoelectric film 11 is not greater than about 800 nm, even if the piezoelectric film 11 includes LT or LN, which is difficult to process, as a main component, it is possible to process the piezoelectric film 11 without causing a defect, such as a crack. Thus, even when the first through via electrode 41 is provided at a position overlapping the first busbar 211, since a defect is unlikely to occur in the piezoelectric film 11, an adverse effect is unlikely to be caused on the frequency characteristics of the elastic wave device. In addition, since the piezoelectric film 11 is thin, heat generated in the first IDT electrode 21 reaches the support 12 by merely moving for a distance (including the thickness of the intermediate layer 13) corresponding to the thickness of the piezoelectric film 11. In the case in which the support 12 includes, as a main component, Si having a high thermal conductivity (thermal conductivity: about 180 W/m·k), heat generated in the first IDT electrode 21 is dissipated therefrom not only through the first through via electrode 41, but also through the support 12. Thus, heat is even more easily dissipated from the first IDT electrode 21. From the same viewpoint, heat is even more easily dissipated also from the second IDT electrode 22.

As described above, in the elastic wave device according to the first preferred embodiment, it is possible to efficiently dissipate heat generated in the first IDT electrode 21 and the second IDT electrode 22. In addition, since the first through via electrode 41 is disposed directly below the first busbar 211, and the second through via electrode 42 is disposed directly below the second busbar 221, it is possible to reduce the size of the substrate 1. Due to such size reduction of the substrate 1, the size of the elastic wave device is reduced. It is preferable that the support 12 includes Si as a main component, because it is easy to process the support 12.

Figure 3A:
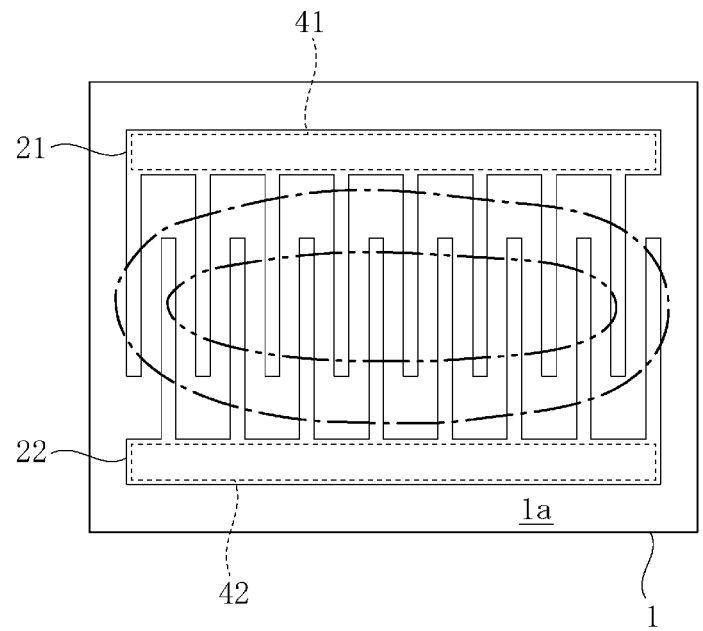
FIGS. 3A and 3B show a temperature distribution generated in a first main surface of a substrate during operation of the elastic wave device.
Figure 3B:
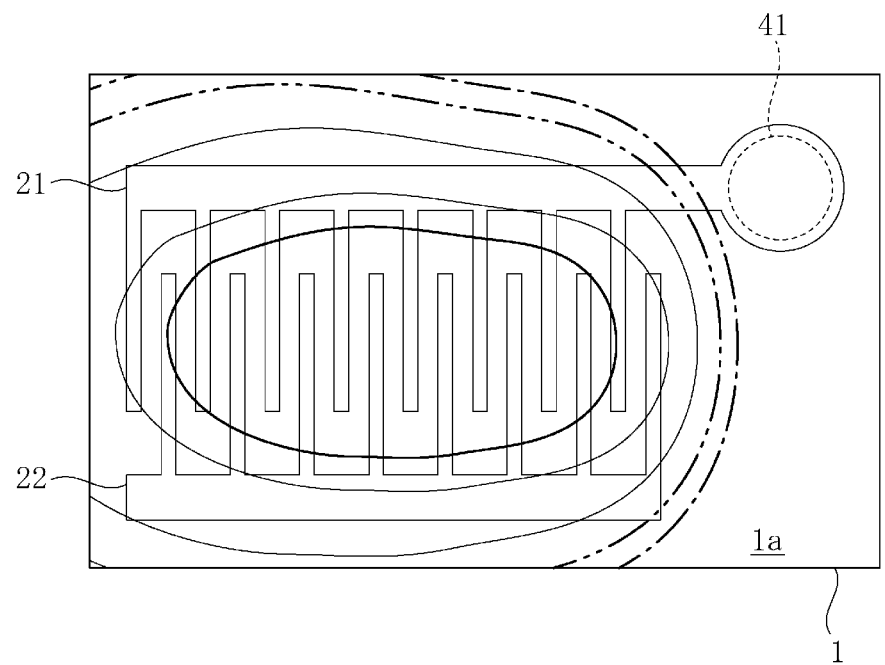

FIGS. 3A and 3B each show a temperature distribution generated in the first main surface 1*a* of the substrate 1 during operation of the elastic wave device, and these temperature distributions are derived by simulation. FIG. 3A shows a result of simulation for the elastic wave device according to the first preferred embodiment, and FIG. 3B shows a result of simulation for an existing elastic wave device. As the existing elastic wave device, a configuration in which the first through via electrode 41 and the second through via electrode 42 each do not overlap both of the first busbar 211 and the second busbar 221 in a plan view from the first main surface 1*a* side (the second through via electrode 42 is not shown).

In the temperature distributions shown in FIGS. 3A and 3B, an alternate long and short dash line represents an isothermal line of about 85° C., and an alternate long and two short dashes line represents an isothermal line of about 90° C. In addition, in the temperature distribution shown in FIG. 3B, a thick solid line located at the innermost side represents an isothermal line of about 105° C. When the temperature distributions shown in FIGS. 3A and 3B are compared to each other, in the elastic wave device according to the first preferred embodiment, the temperature during operation is significantly decreased as compared to that in the existing elastic wave device. That is, in the elastic wave device according to the first preferred embodiment, heat generated in the first IDT electrode 21 and heat generated in the second IDT electrode 22 are efficiently dissipated therefrom through the first through via electrode 41 and the second through via electrode 42, respectively.

FIGS. 4A to 4D are diagrams sequentially showing steps performed to produce the above-described elastic wave device.

Figure 4A:
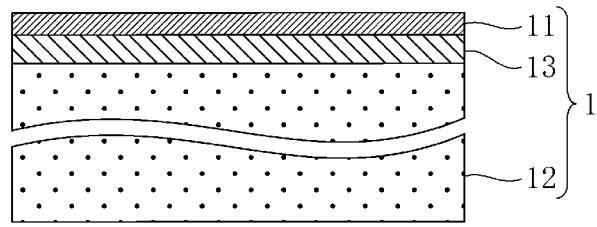
FIGS. 4A to 4D are diagrams sequentially showing steps performed in producing the elastic wave device according to the first preferred embodiment of the present invention.

First, as shown in FIG. 4A, the substrate 1 in which the support 12, the intermediate layer 13, and the piezoelectric film 11 are laminated in this order is formed.

As a non-limiting example, the substrate 1 is formed as follows. First, a crack layer is formed by injecting hydrogen ions (H+) into an LT substrate through one surface thereof. Next, an SiO$_2$ layer (the intermediate layer 13) is formed on the other surface of the LT substrate (the surface at the side opposite to the crack layer). To form the SiO$_2$ layer, for example, a film formation method, such as a sputtering method, a CVD (Chemical Vapor Deposition) method is preferably used. The surface of the SiO$_2$ layer is made smooth, and then an Si substrate (the support 12) is joined to the surface. Thereafter, by heating the LT substrate, the crack layer is separated therefrom, and the other portion is left on the surface of the SiO$_2$ layer. Accordingly, an LT film (the piezoelectric film 11) is formed on the surface of the SiO$_2$ layer. Then, the formed LT film is planarized.

The LT film may be formed by the above-described method of formation and separation of the crack layer on the LT substrate, or may be formed by cutting the LT substrate.

Figure 4B:
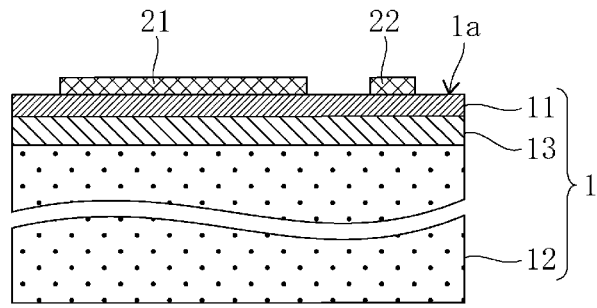

Next, as shown in FIG. 4B, the first IDT electrode 21 and the second IDT electrode 22 are formed on the front surface of the piezoelectric film 11 (the first main surface 1a of the substrate 1). As an example, the first IDT electrode 21 and the second IDT electrode 22 are formed using a lift-off method, which is a type of vapor deposition method.

Specifically, a patterning resist is formed on the front surface of the piezoelectric film 11, and then the resist in the regions in which the first IDT electrode 21 and the second IDT electrode 22 are to be formed is removed, such that a pattern for IDT electrode formation is formed. Next, an electrode material is deposited on the exposed surface of the piezoelectric film 11 and the resist surface, and then the resist is removed, such that only a deposited film is left on the exposed surface of the piezoelectric film 11. As the electrode material, a material from which a reaction product having a high vapor pressure is not generated even when the material is exposed to plasma for reactive ion etching (RIE) using a fluorine-based gas, such as aluminum (Al), platinum (Pt), copper (Cu), and gold (Au), for example, is preferably used.

Figure 4C:
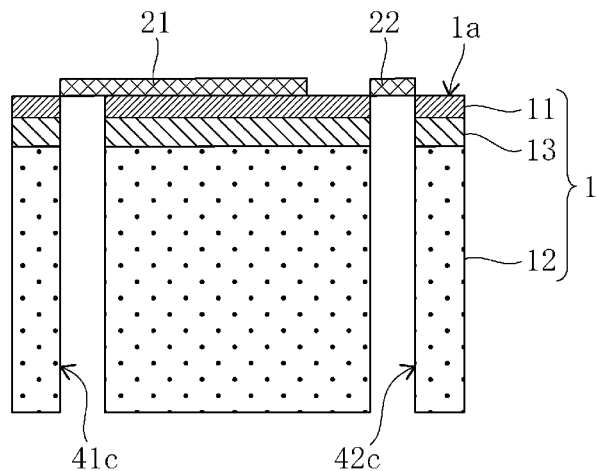

Next, as shown in FIG. 4C, through holes 41c and 42c that are to be used for forming the first through via electrode 41 and the second through via electrode 42, respectively, are formed. Specifically, a patterning resist is formed on the back surface of the support 12 (the second main surface 1b of the substrate 1), and the resist in the regions in which the through holes 41c and 42c are to be formed is removed, such that a pattern for through hole formation is formed. Next, reactive ion etching (RIE) is performed on the substrate 1 based on the pattern, such that the through holes 41c and 42c are formed. Thereafter, the resist is removed.

In the case in which the support 12 includes Si as a main component, the Bosch process is preferably used to etch the support 12, since the straightness of the through holes 41c and 42c in a direction perpendicular or substantially perpendicular to the second main surface 1b is good. In addition, in the case in which the intermediate layer 13 includes SiO$_2$ as a main component, RIE using a fluorine-based gas is preferably used to etch the intermediate layer 13 for the following reason. Specifically, the first IDT electrode 21 and the second IDT electrode 22, which are formed from the electrode material, such as Al, Pt, Cu, and Au, for example, are prevented from being etched after the through holes 41c and 42c reach the first main surface 1a.

Figure 4D:
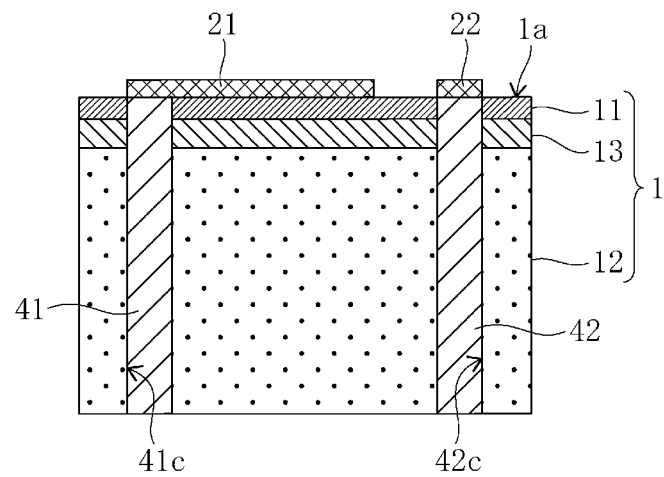

Next, as shown in FIG. 4D, the through holes 41c and 42c are filled with the electrode material, such that the first through via electrode 41 and the second through via electrode 42 are formed. As an example, a filling plating is used to fill the through holes 41c and 42c with the electrode material. As the electrode material, for example, Cu having a high electric conductivity and a very high thermal conductivity (thermal conductivity: about 400 W/m·k) is preferably used.

Next, the solder resist 50 is formed on the back surface of the Si substrate (the second main surface 1b of the substrate 1) (see FIG. 2B). The solder resist 50 includes a pattern that is opened in the regions in which the first external electrode 31 and the second external electrode 32 are to be formed. Thereafter, the first external electrode 31 and the second external electrode 32 are formed in the cavities of the solder resist 50. For example, bump electrodes or planar electrodes are used as the first external electrodes 31 and the second external electrodes 32.

Second Preferred Embodiment

Figure 5A:
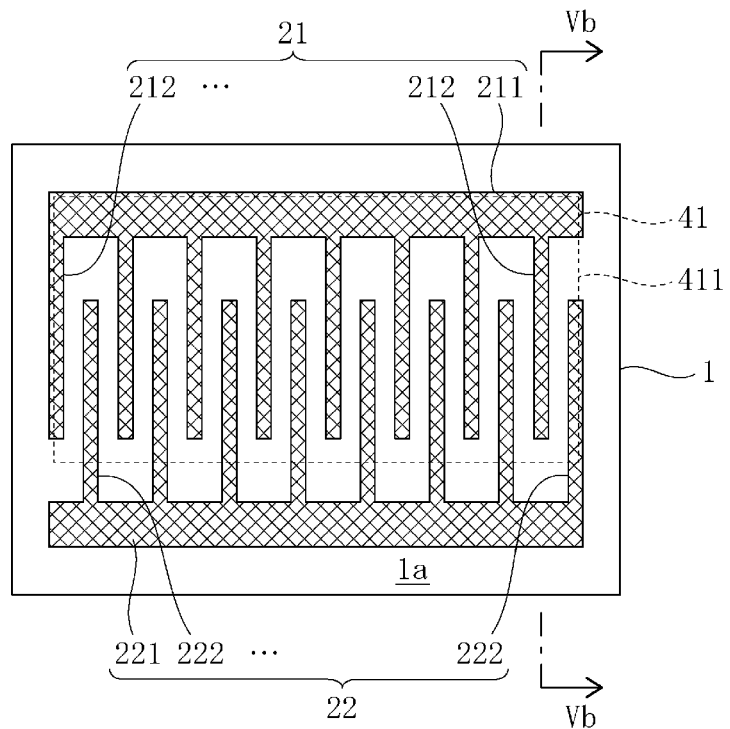
FIG. 5A is a plan view conceptually illustrating an elastic wave device according to a second preferred embodiment.
Figure 5B:
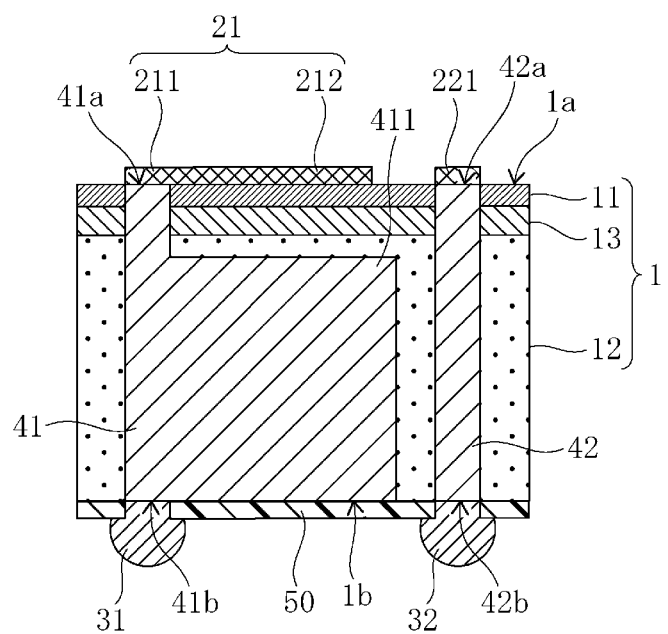
FIG. 5B is a cross-sectional view taken along a line Va-Va shown in FIG. 5A.

FIG. 5A is a plan view conceptually illustrating an elastic wave device according to a second preferred embodiment of the present invention, and FIG. 5B is a cross-sectional view taken along a line Vb-Vb shown in FIG. 5A. As shown in FIGS. 5A and 5B, the first through via electrode 41 may include an overlapping portion 411 that overlaps at least a portion of the plurality of first electrode fingers 212 in a plan view from the first main surface 1a (or the second main surface 1b) side. In the present preferred embodiment, the overlapping portion 411 overlaps all of the first electrode fingers 212. As shown in FIG. 5B, the overlapping portion 411 is preferably provided in the substrate 1 and in a region different from the piezoelectric film 11 (mainly in the support 12).

In the elastic wave device according to the second preferred embodiment, it is possible to further efficiently dissipate heat generated in the first IDT electrode 21 and the second IDT electrode 22, through the overlapping portion 411.

The overlapping portion may be provided in the second through via electrode 42, instead of in the first through via electrode 41. In addition, the overlapping portion may be provided in each of the first through via electrode 41 and the second through via electrode 42. In this case, both overlapping portions are disposed so as not to be conducted to each other in the substrate 1.

Third Preferred Embodiment

Figure 6:
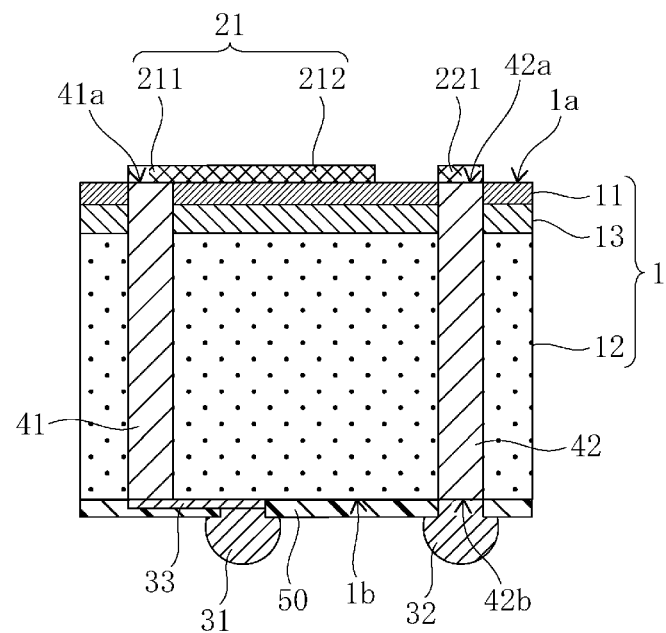
FIG. 6 is a cross-sectional view conceptually illustrating an elastic wave device according to a third preferred embodiment of the present invention.

FIG. 6 is a cross-sectional view conceptually illustrating an elastic wave device according to a third preferred embodiment of the present invention. As shown in FIG. 6, the first external electrode 31 may be provided on the second main surface 1b and in a region that does not overlap the exposed surface 41b of the first through via electrode 41. In this case, the first through via electrode 41 and the first external electrode 31 are connected to each other via a wiring layer 33 provided on the second main surface 1b.

Instead of the first external electrode 31, the second external electrode 32 may be provided on the second main surface 1b and in a region that does not overlap the exposed surface 42b of the second through via electrode 42. In addition, each of the first external electrode 31 and the second external electrode 32 may be provided in a region that does not overlap both of the exposed surfaces 41b and 42b.

Fourth Preferred Embodiment

Figure 7:
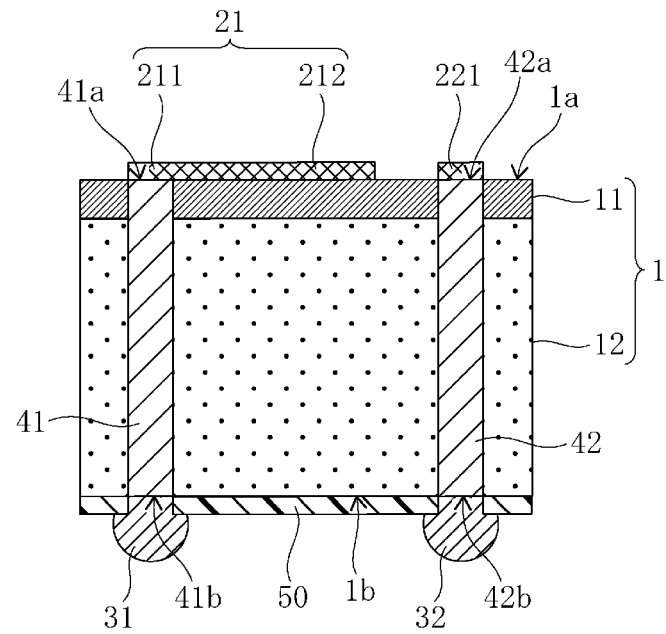
FIG. 7 is a cross-sectional view conceptually illustrating an elastic wave device according to a fourth preferred embodiment of the present invention.

FIG. 7 is a cross-sectional view conceptually illustrating an elastic wave device according to a fourth preferred

What is claimed is:

1. An elastic wave device comprising:
a substrate including a first main surface, a second main surface located at sides opposite to each other, and a piezoelectric film;
a first IDT electrode provided on the first main surface and including a first busbar and a plurality of first electrode fingers extending from the first busbar;
a first external electrode provided on the second main surface; and
a first through via electrode penetrating the substrate from the first main surface to the second main surface and electrically connecting the first IDT electrode and the first external electrode to each other; wherein
at least a portion of the first through via electrode overlaps the first busbar in a plan view from the first main surface side and is in contact with the first busbar; and
the first through via electrode includes an overlapping portion that overlaps at least a portion of the plurality of first electrode fingers in the plan view.

2. The elastic wave device according to claim 1, further comprising:
a second IDT electrode provided on the first main surface and including a second busbar facing the first busbar and a plurality of second electrode fingers extending from the second busbar toward the first busbar;
a second external electrode provided on the second main surface; and
a second through via electrode penetrating the substrate from the first main surface to the second main surface and electrically connecting the second IDT electrode and the second external electrode to each other; wherein
at least a portion of the second through via electrode overlaps the second busbar in the plan view and is disposed directly below the second busbar.

3. The elastic wave device according to claim 2, wherein the second external electrode does not overlap an exposed surface of the second through via electrode on the second main surface.

4. The elastic wave device according to claim 3, wherein the second through via electrode and the second external electrode are connected to each other via a wiring layer provided on the second main surface.

5. The elastic wave device according to claim 2, wherein the second busbar extends in a direction perpendicular or substantially perpendicular to a direction in which the plurality of second electrode fingers extend, and is directly connected to one end of each of the plurality of second electrode fingers.

6. The elastic wave device according to claim 2, wherein the plurality of first electrode fingers and the plurality of second electrode fingers are alternately arranged in a direction in which the first busbar extends.

7. The elastic wave device according to claim 2, wherein the second external electrode is a solder bump.

8. The elastic wave device according to claim 2, wherein the second through via electrode linearly extends from the first main surface to the second main surface in a direction perpendicular or substantially perpendicular to the first and second main surfaces.

9. The elastic wave device according to claim 2, wherein an exposed surface of the second through via electrode on the first main surface entirely or substantially entirely overlaps the second busbar.

10. The elastic wave device according to claim 2, wherein the second through via electrode is directly connected to the second external electrode.

11. The elastic wave device according to claim 1, wherein
the substrate further includes a support supporting the piezoelectric film and an intermediate layer between the piezoelectric film and the support;
the intermediate layer is a low acoustic velocity layer in which a propagation velocity of a bulk wave is lower than that in the piezoelectric film; and
the overlapping portion is not in contact with the low acoustic velocity layer.

12. The elastic wave device according to claim 11, wherein the intermediate layer includes silicon oxide as a main component.

13. The elastic wave device according to claim 1, wherein the first through via electrode is directly connected to the first external electrode.

14. The elastic wave device according to claim 1, wherein
the substrate further includes a support supporting the piezoelectric film;
the piezoelectric film includes, as a main component, at least one of lithium tantalate and lithium niobate; and
the support includes silicon as a main component.

15. The elastic wave device according to claim 1, wherein the first busbar extends in a direction perpendicular or substantially perpendicular to a direction in which the plurality of first electrode fingers extend, and is directly connected to one end of each of the plurality of first electrode fingers.

16. The elastic wave device according to claim 1, wherein a solder resist is provided on the second main surface of the substrate.

17. The elastic wave device according to claim 1, wherein the first external electrode is a solder bump.

18. The elastic wave device according to claim 1, wherein an exposed surface of the first through via electrode on the first main surface entirely or substantially entirely overlaps the first busbar.

19. The elastic wave device according to claim 1, wherein the piezoelectric film has a thickness of not less than about 200 nm and not more than about 800 nm.

* * * * *